(12) United States Patent
Hsu et al.

(10) Patent No.: US 9,362,501 B2
(45) Date of Patent: Jun. 7, 2016

(54) METAL MASK

(71) Applicant: Forhouse Corporation, Taichung (TW)

(72) Inventors: Chieh-Hao Hsu, Taoyuan (TW); Feng Yang Hsieh, Taoyuan (TW)

(73) Assignee: DARWIN PRECISIONS CORPORATION, Taichung (TW)

( * ) Notice: Subject to any disclaimer, the term of this patent is extended or adjusted under 35 U.S.C. 154(b) by 0 days.

(21) Appl. No.: 14/303,691

(22) Filed: Jun. 13, 2014

(65) Prior Publication Data

US 2015/0013600 A1 Jan. 15, 2015

(30) Foreign Application Priority Data

Jul. 9, 2013 (TW) .............................. 102124560 A (51) Int. Cl.
| | | |
|---|---|---|
| *B05C 21/00* | (2006.01) | |
| *H01L 51/00* | (2006.01) | |
| *C23C 14/04* | (2006.01) | |
| *C23C 14/12* | (2006.01) | |
| *C23C 14/24* | (2006.01) | |

(52) U.S. Cl.
CPC .......... *H01L 51/0011* (2013.01); *B05C 21/005* (2013.01); *C23C 14/042* (2013.01); *C23C 14/12* (2013.01); *C23C 14/24* (2013.01)

(58) Field of Classification Search
None
See application file for complete search history.

(56) References Cited

U.S. PATENT DOCUMENTS

| | | | |
|---|---|---|---|
| 2002/0025406 A1* | 2/2002 | Kitazume | ..................... 428/136 |
| 2004/0104197 A1 | 6/2004 | Shigemura et al. | |
| 2007/0157879 A1 | 7/2007 | Yotsuya | |
| 2007/0159048 A1 | 7/2007 | Chang et al. | |

FOREIGN PATENT DOCUMENTS

| | | |
|---|---|---|
| CN | 1510971 A | 7/2004 |
| CN | 101451227 A | 6/2009 |
| TW | 200727448 | 7/2007 |
| TW | 200740288 | 10/2007 |

* cited by examiner

*Primary Examiner* — Dah-Wei D Yuan
*Assistant Examiner* — Jethro M Pence
(74) *Attorney, Agent, or Firm* — Muncy, Geissler, Olds & Lowe, P.C.

(57) ABSTRACT

A metal mask is provided. The metal mask includes a mask portion and an end portion. The mask portion has a mask body and an outer frame surrounding and being connected to the mask body. The end portion connects one end of the mask portion. At least one of the mask portion and the end portion has at least one recessed portion located outside the mask body. The ratio of a total capacity of the at least one recessed portion to a total volume of the mask portion and the end portion is between 0.087 and 0.667.

9 Claims, 7 Drawing Sheets

METAL MASK

BACKGROUND OF THE INVENTION

1. Field of the Invention

The present invention relates to a metal mask; particularly, the present invention relates to a metal mask having an anti-tension design.

2. Description of the Prior Art

Figure 1:
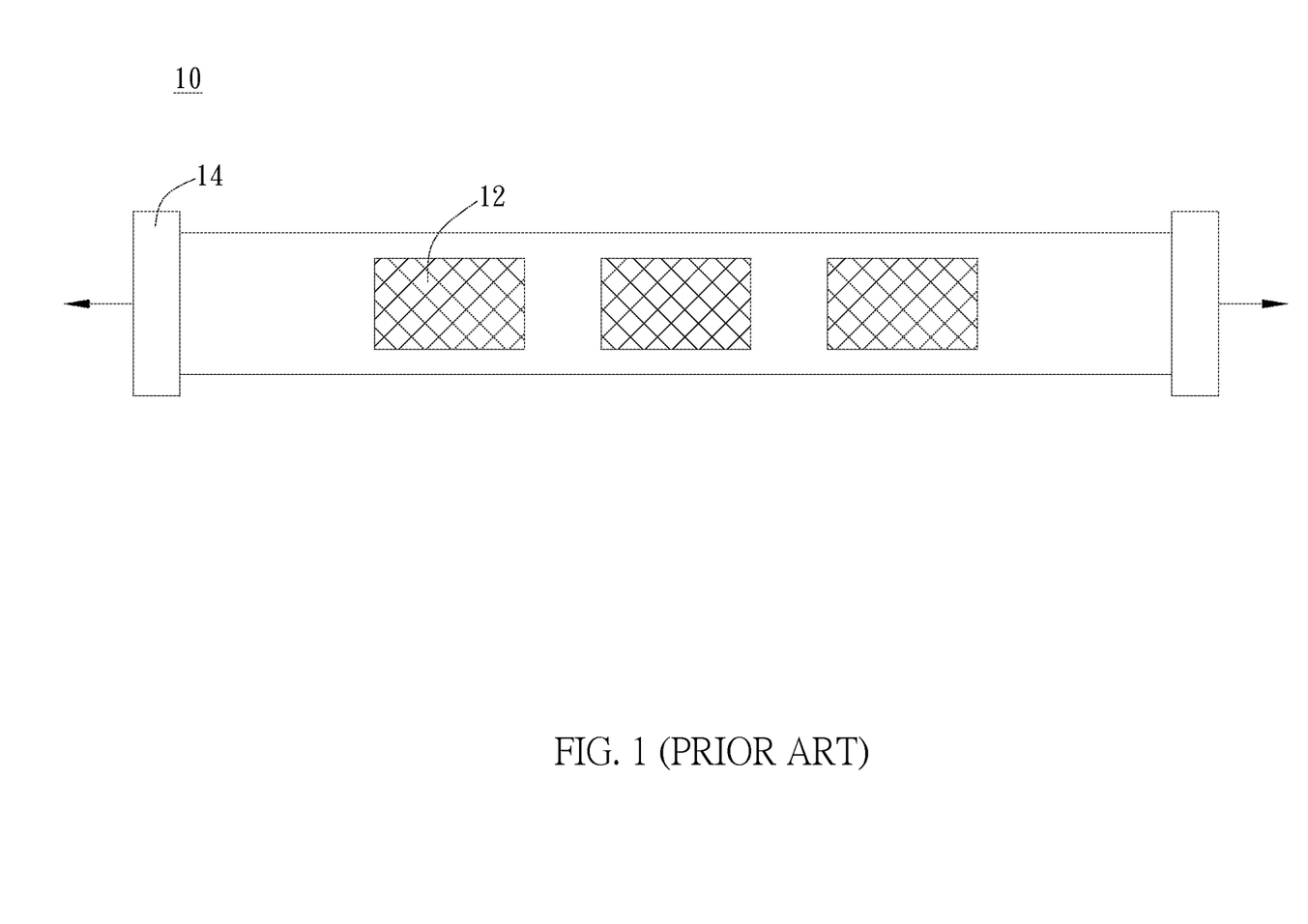
FIG. 1 is a top view of a traditional metal mask.

Because the organic light emitting diode display (OLED) has characteristics such as low power consumption, thin thickness, and self-light-emitting, people have paid more attention to the OLED recently. In a manufacturing process of the OLED, the quality of a vapor deposition process will directly affect a yield rate of the OLED, wherein a metal mask is one of the most important units under the vapor deposition process. FIG. 1 is a top view of a traditional metal mask. As shown in FIG. 1, the traditional metal mask 10 is a long thin slice having several mask bodies 12 disposed along the extending direction of the metal mask 10. In the vapor deposition process, each mask body 12 corresponds to a substrate. The mask body 12 is a structure having many tiny holes that allow liquid crystal molecules to pass therethrough under the vapor deposition process to form a coating film and liquid crystal molecules can be arranged in a predetermined shape. As such, the smoothness of a surface of the traditional metal mask 10 and a horizontal position of the traditional metal mask 10 disposed during the vapor deposition process are closely related to the yield rate of the organic light emitting diode display.

As shown in FIG. 1, in order to smoothen and keep the surface of the traditional metal mask at the horizontal position before the vapor deposition process, tension force is applied by a clamp device at two ends of the traditional metal mask 10 (shown by the arrows). A compressed stress occurred in a width direction of the thin slice traditional metal mask 10 under the tension force. However, when the tension force is beyond a critical value, wrinkles will appear on the surface of the traditional metal mask 10 because of the excessive stress along the width direction. Once wrinkles appear on the surface of the metal mask, the path of the mask body 12 along which liquid crystal molecules pass through will be affected, resulting in a poor vapor deposition quality because of change in smoothness. In order to prevent the change in smoothness mentioned above, the structure of the traditional metal mask requires improvement.

SUMMARY OF THE INVENTION

It is an object of the present invention to provide a metal mask for decreasing folds formed on the metal mask during vapor deposition process.

A metal mask is provided. The metal mask includes a mask portion and an end portion. The mask portion has a mask body and an outer frame surrounding and being connected to the mask body. The end portion connects an end of the mask portion. At least one of the mask portion and the end portion has at least one recessed portion located outside the mask body. The ratio of a total capacity of the at least one recessed portion to a total volume of the mask portion and the end portion is between 0.087 and 0.667. The recessed portion can be disposed on the mask portion and the end portion to allow the metal mask to have different thickness for changing the stress distribution and decreasing the formation of the fold, so that the metal mask can be smooth and a yield rate can be improved.

DETAILED DESCRIPTION OF THE PREFERRED EMBODIMENT

A metal mask of the present invention utilizes a recessed portion formed on a surface of the metal mask to allow the metal mask to have different thickness, so that the stress can be decreased while a tension force is applied to the metal mask, and the formation of folds can also be reduced. The metal mask of the present invention is preferably utilized in a vapor deposition process of an organic light emitting diode display.

Figure 2A:
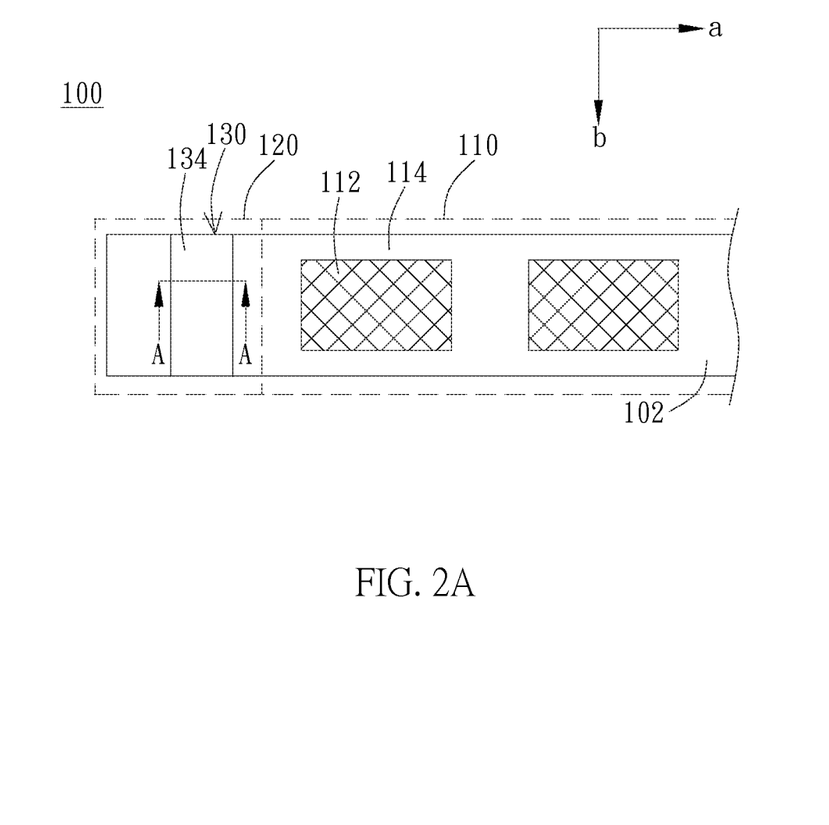
FIG. 2A is a top view of a metal mask of the present invention.

FIG. 2A is a top view of a metal mask of the present invention. As shown in FIG. 2, the metal mask 100 includes a mask portion 110 and an end portion 120. The mask portion 110 means the middle section of the metal mask 100, including several mask bodies 112 and an outer frame 114 surrounding and being connected to mask bodies 112. The mask body 112 corresponds to a substrate during the vapor deposition process. The metal mask 100 may include a plurality of mask portions 110 according to the process requirements, and the number of the mask bodies 112 can be adjusted accordingly. The mask bodies 112 are distributed in an interval along an extending direction (a) of the metal mask 100, and the part of the mask portion 110 that surrounds the mask bodies 112 is the outer frame 114. On the other hand, the end portion 120 means the part fixed by a fixation device while the metal mask 100 is used in the vapor deposition process. As shown in FIG. 2A, the end portion 120 is located at an outmost side along the extending direction (a) of the metal mask 100 and connects one end of the mask portion 110.

Figure 2B:
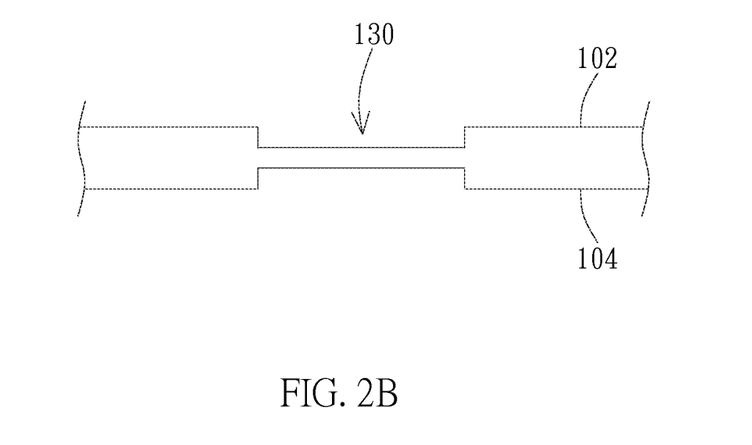
FIG. 2B to FIG. 2D are enlarged cross-sectional views of different embodiments of a recessed portion.

Besides, a recessed portion 130 is formed on a surface of the metal mask 100 outside the mask body 112. It is noted that the mask portion 110 and the end portion 120 together have a rear surface 102 and a vapor deposition surface 104 (referring to FIG. 2B) opposite to the rear surface 102, so that the surface having the recessed portion 130 formed includes the rear surface 102 and the vapor deposition surface 104. The rear surface 102 is the surface that faces the substrate. The distribution of the recessed portion 130 may refer to FIG. 2B. FIG. 2B is an enlarged cross-sectional view of the recessed portion 130 along the A-A direction. As shown in FIG. 2B, the recessed portion 130 is preferably formed on the rear surface 102 and the vapor deposition surface 104. The recessed portion 130 on the rear surface 102 corresponds to the recessed portion 130 on the vapor deposition surface 104, and the two recessed portions 130 have the same recessed depth. By changing the thickness of the metal mask 100, the stress can be decreased when the tension force is applied to the metal mask 100, so that the formation of folds can be reduced.

Moreover, the ratio of a capacity of the recessed portion 130 to a volume of the end portion 120 (after cut out) is preferably between 0.087 and 0.667. That is, the cut-out volume of the recessed portion 130 is about 8%~40% of the volume of the end portion 120 (before cut out), and the volume of the end portion 120 after cut out is about 60%~92% of the volume of the end portion 120 before cut out.

Besides, in the embodiment shown in FIG. 2A, one end recessed portion 134 is formed on the surface of the end portion 120 along a width direction (b), but the number and the location of the end recessed portion 134 is not limited thereto. The quantity, shape, and distribution location of the end recessed portion 134 can be adjusted according to the material and the length-width ratio of the metal mask 100. Similarly, when the end portion 120 includes a plurality of end recessed portions 134, the ratio of a total capacity of the end recessed portions 134 to a volume of the end portion 120 is between 0.087 and 0.667. By this design, the smoothness of the metal mask 100 can be improved during the vapor deposition process to increase the yield rate; the lifetime of the metal mask 100 can also be extended and the processing cost is lowered.

Figure 2C:
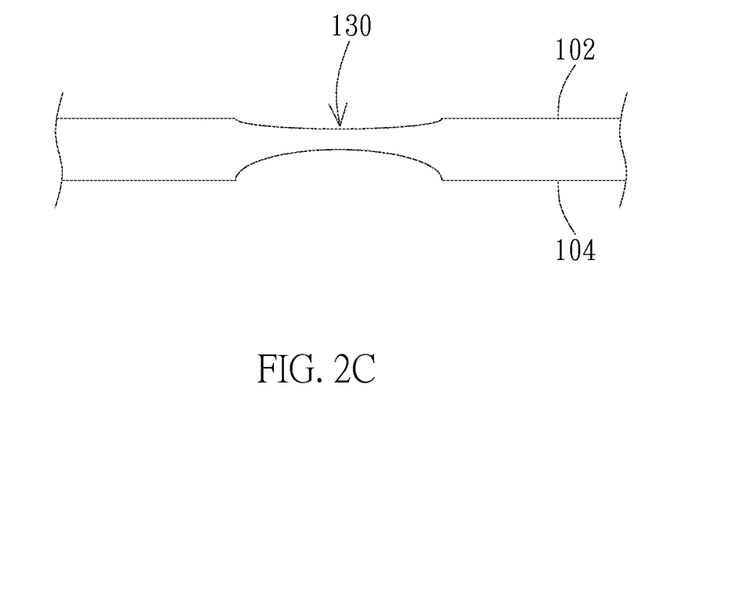
Figure 2D:
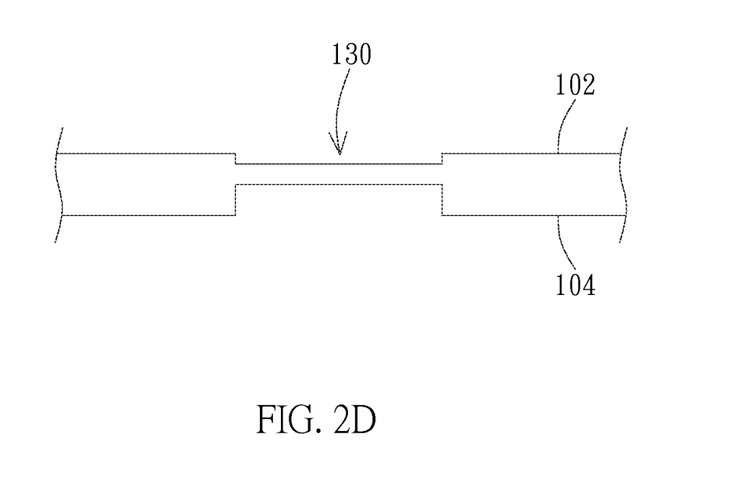

Besides, in the embodiment shown in FIG. 2B, the recessed portions 130 at opposite surfaces have the same thickness, but not limited to. FIG. 2C is an enlarged cross-sectional view of another embodiment of the recessed portion 130 along the A-A direction. As shown in FIG. 2C, the recessed portions 130 are respectively formed on the rear surface 102 and the vapor deposition surface 104 and have a form of a curved surface with different recessed depth. Two sides of the curved surfaces have the same thickness with the metal mask for providing a better force transmission effect along the extending direction while the tension force is applied to the metal mask, maintaining the structural stability of the metal mask. The recessed portions 130 shown in FIG. 2D are respectively formed on the rear surface 102 and the vapor deposition surface 104 and have a rectangular cross-section with different recessed depth.

Figure 3:
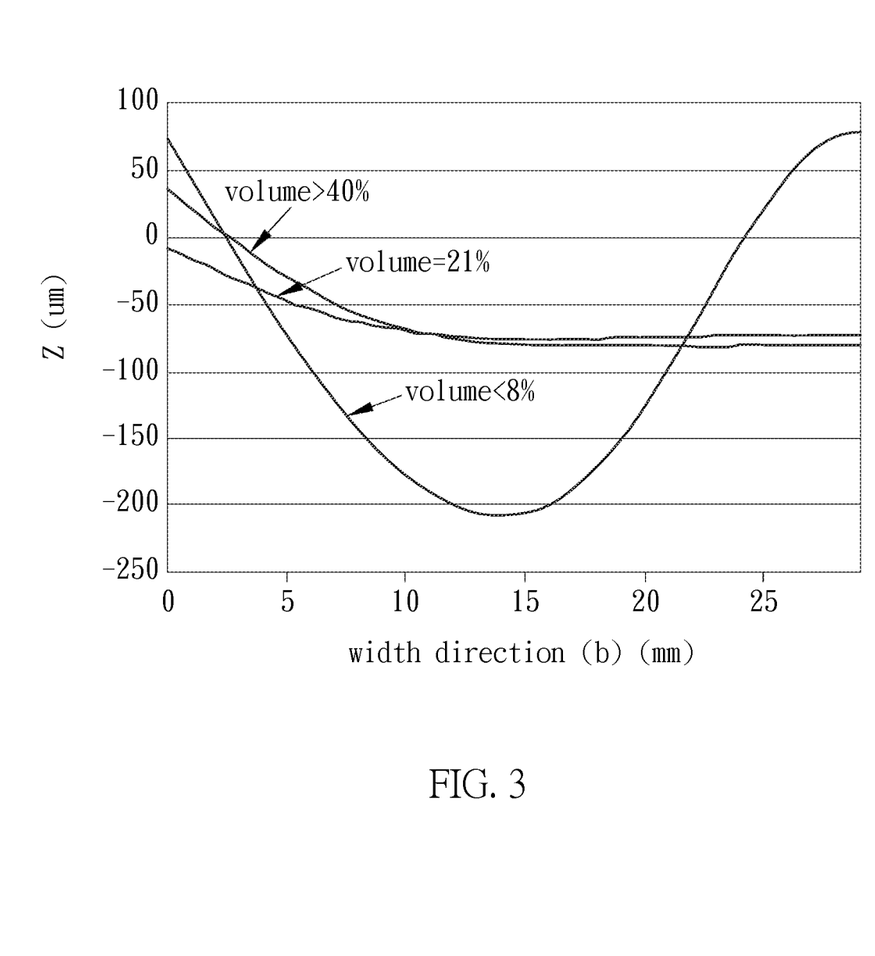
FIG. 3 is a diagram showing the relation of a volume of the recessed portion to different folds.

As described above, the cut-out volume of the recessed portion 130 is about 8%~40% of the volume of the end portion 120 (before cut out). Please refer to the experimental result shown in FIG. 3. FIG. 3 is a diagram showing the relation of a volume of the recessed portion to different folds. The curves shown in FIG. 3 represent different ratio of the cut-out volume of the recessed portion to the volume of the end portion (before cut out). Similarly, if the recessed portion is formed on the mask portion, the curves will represent different ratio of the cut-out volume of the recessed portion to the volume of the mask portion (before cut out). The variation of the curves represents variation in height (z) of the surface measured along the width direction (b) while the tension force is applied to the metal mask. According to the experimental result and the diagram of FIG. 3, when the volume of the recessed portion is less than 8%, the effect of decreasing folds is not good because of insufficient cut-out volume. On the other hand, when the volume of the recessed portion is more than 40%, the strength of the metal mask is insufficient and the amplitude of folds changes significantly because of excessive cut-out volume. Moreover, when the volume of the recessed portion is 21%, minimum amplitude changes on the surface of the metal mask is obtained for maintaining smoothness and structural stability of the metal mask.

Figure 4A:
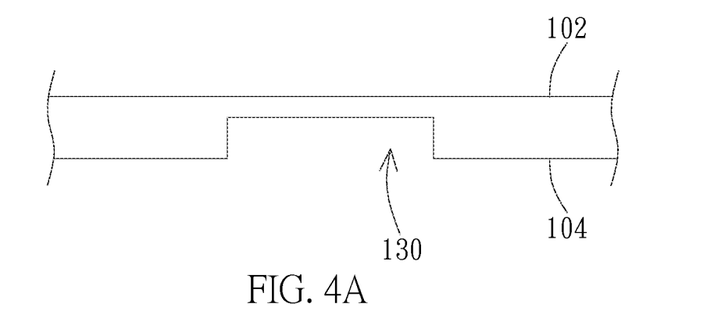
FIG. 4A to FIG. 4C are enlarged cross-sectional views of different embodiments of the recessed portion.
Figure 4B:
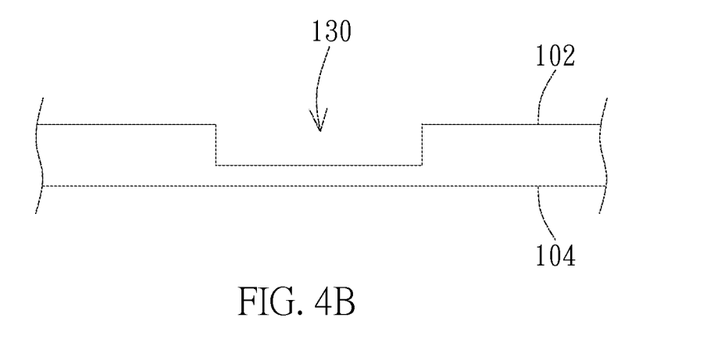
Figure 4C:
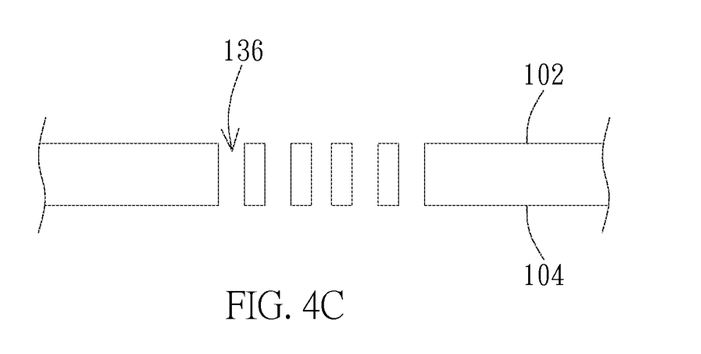

In addition, the recessed portion 130 can be formed only on the rear surface 102 or the vapor deposition surface 104, or directly penetrating through the surface of the metal mask 100 as through holes. FIG. 4A to FIG. 4C are enlarged cross-sectional views of different embodiments of the recessed portion 130. The recessed portion 130 shown in FIG. 4A is formed on the vapor deposition surface 104. The recessed portion 130 shown in FIG. 4B is formed on the rear surface 102. The recessed portion shown in FIG. 4C utilizes a plurality of through holes 136 penetrating through the rear surface 102 and the vapor deposition surface 104. For the recessed portion shown in FIG. 4C, the capacity of the recessed portion means the space cut out by all through holes 136. For example, when the end portion 120 includes a plurality of end recessed portions 134, a part of the end recessed portions 134 can be formed on the vapor deposition surface 104 of the metal mask 100 (as show in FIG. 4A) and another part of the end recessed portions 134 can penetrate through the rear surface 102 and the vapor surface 104 by through holes 136 (as shown in FIG. 4C).

Figure 5:
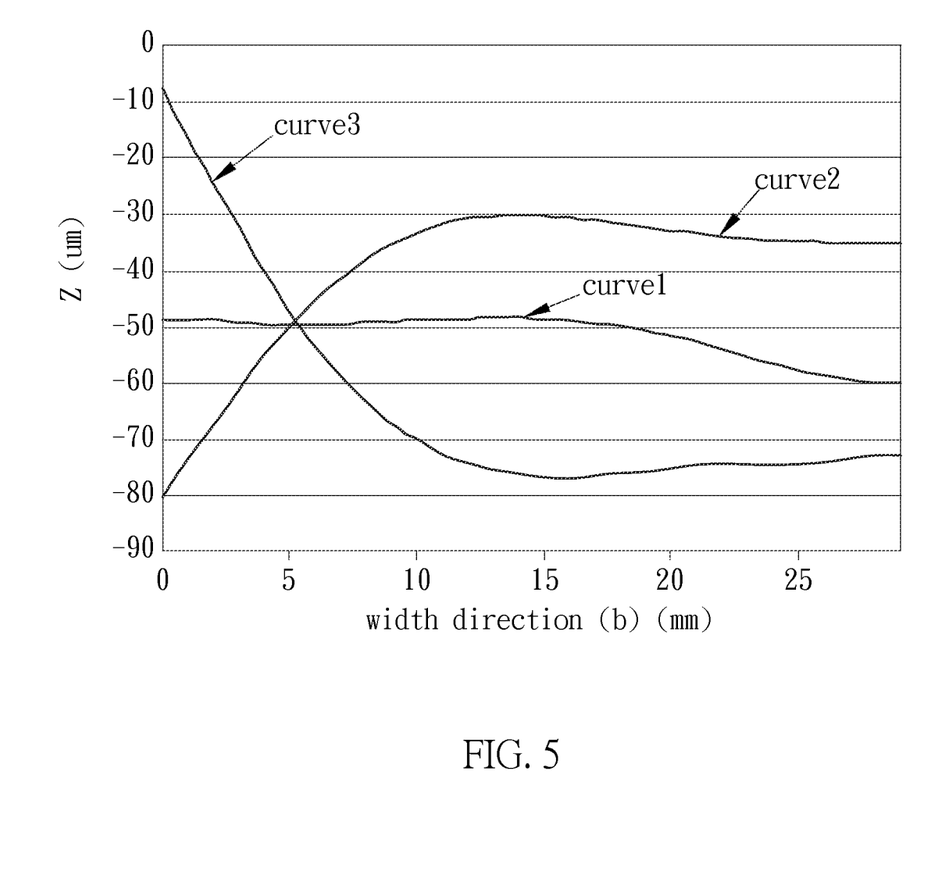
FIG. 5 is a diagram showing variation of folds in different kinds of recessed portions.

For different kinds of recessed portions mentioned above, one kind of the recessed portion or a combination of different kinds of the recessed portions can be selected when the metal mask has a plurality of recessed portions. FIG. 5 is a diagram showing variation of folds in different kinds of recessed portions. Curve 1 represents the structure of the metal mask having recessed portions formed on the vapor deposition surface and the rear surface (shown in FIG. 2B). Curve 2 represents the structure of the metal mask having recessed portions formed only on the rear surface (shown in FIG. 4B). Curve 3 represents the structure of the metal mask having recessed portions formed only on the vapor deposition surface (shown in FIG. 4A). The variation of the curves represents variation in height (z) of the surface measured along the width direction (b) while the tension force is applied to the metal mask. As shown in FIG. 5, adopting the recessed portion shown in FIG. 2B (curve 1) can have a better anti-wrinkle effect, while adopting the recessed portion shown in FIG. 4A (curve 2) and FIG. 4B (curve 3) can also have the anti-wrinkle effect. As such, the smoothness of the surface can be effectively improved by changing the thickness of the metal mask, and the wrinkle effect can be eliminated by selecting different distribution of the recessed portion. For example, the recessed portion having a better anti-wrinkle effect shown in FIG. 2B may be formed around the mask body, and the recessed portion shown in FIG. 4A or FIG. 4B may be formed on the end portion. Combinations of different recessed portions can refer to embodiments shown in FIG. 6 and FIG. 7.

Figure 6:
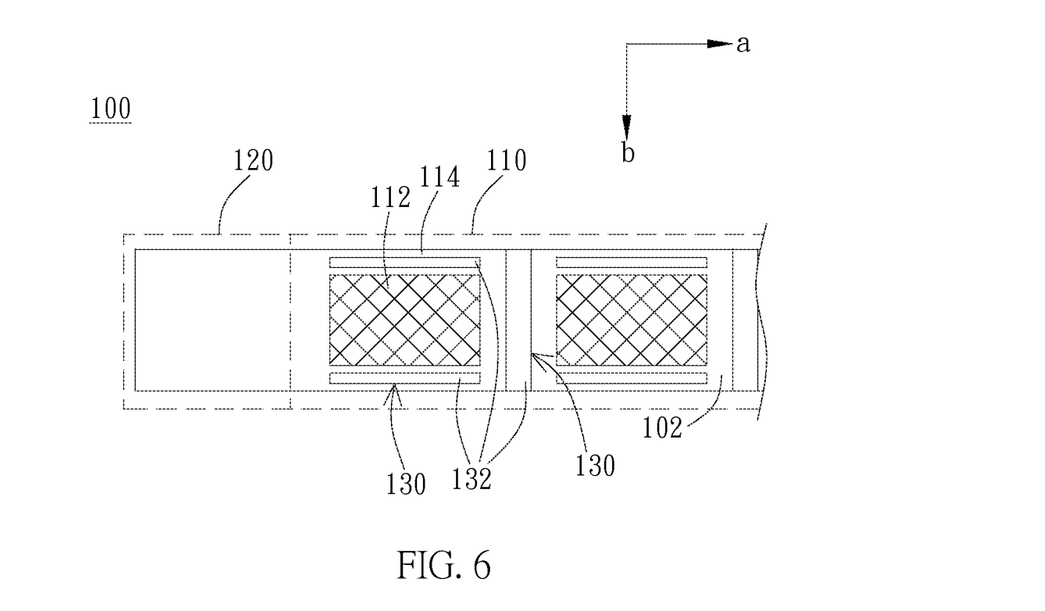
FIG. 6 is a top view of another embodiment of the metal mask of the present invention.

In addition to be formed on the end portion 120, the recessed portion 130 can be formed on the mask portion 110. FIG. 6 is a top view of another embodiment of the metal mask 100 of the present invention. As shown in FIG. 6, the mask portion 110 is in a form of an elongated shape, and the recessed portion 130 can be formed in the mask portion 110 or formed between the mask bodies 112. Particularly, a mask recessed portion 132 in the mask portion 110 is formed on the surface of the outer frame 114, extends along the extending direction (a) of the mask portion 110, and is located at two sides of the mask body 112 in the width direction (b). The mask recessed portion 132 between the mask bodies 112 crosses the extending direction (a) of the mask portion 110 and extends along the width direction (b) and between adjacent mask bodies 112. In other words, the extending direction of the mask recessed portion 132 between mask bodies 112 is perpendicular to the extending direction (a). The cross-sectional view of the mask recessed portion 132 can have the same structure as shown in FIG. 2B to FIG. 2D and FIG. 4A to FIG. 4C and is not elaborated herein. As to the ratio, the ratio of the total capacity of the mask recessed portion 132 to the total volume of the mask portion 110 (after cut out) is preferably between 0.087 and 0.667. In other embodiments, the cut-out volume may be increased to obtain the ratio of the total capacity of the mask recessed portion 132 to the total volume of the mask portion 110 (after cut out) between 0.11 and 0.667. By this design, the stress can be decreased while the tension force is applied to the metal mask 100 for decreasing the formation of the fold and maintaining the structural stability.

The mask recessed portion 132 preferably adopts the structure shown in FIG. 2B, formed on the rear surface 102 and the vapor deposition surface 104. Besides, a combination of the mask recessed portion 132 in the mask portion 110 and the mask recessed portion 132 between mask bodies 112 can be selected for providing different thickness. For example, combination (1) includes selecting the structure shown in FIG. 4A as the mask recessed portion 132 in the mask portion 110 which is formed on the vapor deposition surface 104 of the metal mask 100 and selecting the structure shown in FIG. 4C as the mask recessed portion 132 between the mask bodies 112 which penetrates the vapor deposition surface 104 and the rear surface 102 by through holes 136. Combination (2) includes selecting the structure shown in FIG. 4B as the mask recessed portion 132 in the mask portion 110 which is formed on the rear surface 102 of the metal mask 100 and selecting the structure shown in FIG. 4C as the mask recessed portion 132 between the mask bodies 112 which penetrates the vapor deposition surface 104 and the rear surface 102 by through holes 136.

Figure 7:
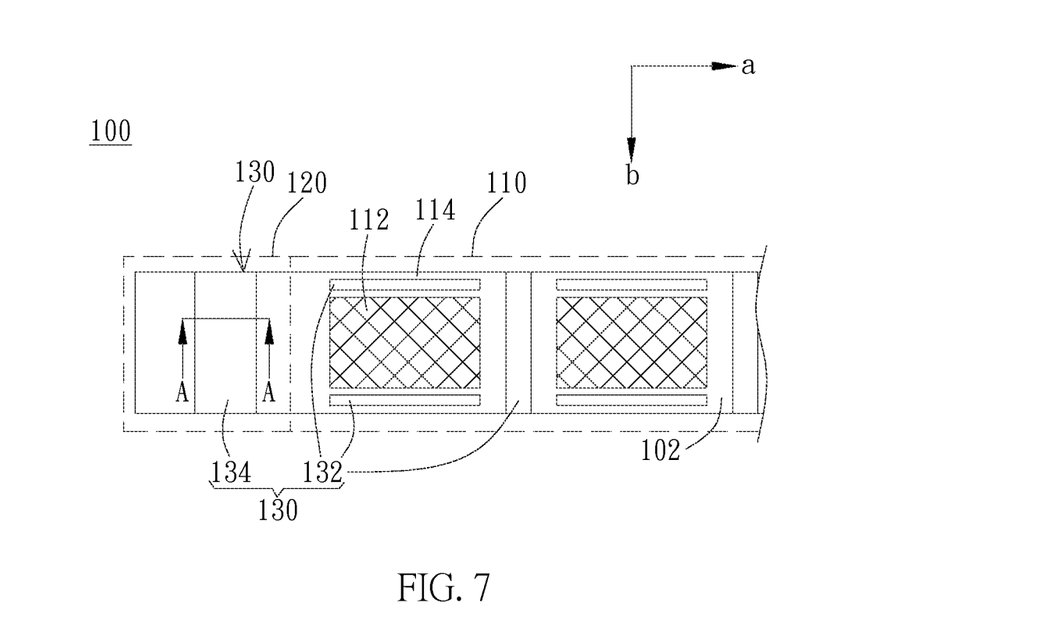
FIG. 7 is a top view of another embodiment of the metal mask of the present invention.

FIG. 7 is a top view of another embodiment of the metal mask 100 of the present invention. As shown in FIG. 7, the recessed portions 130 can be formed in the end portion 120, the mask portion 110, or between the mask bodies 112. Particularly, the end recessed portion 134 in the end portion 120 is formed on the surface of the metal mask 100 along the width direction (b). The mask recessed portion 132 in the mask portion 110 is formed on the surface of the outer frame 114, extends along the extending direction (a) of the mask portion 110, and is located at two sides of the mask body 112 in the width direction (b). The mask recessed portion 132 between the mask bodies 112 crosses the extending direction (a) of the mask portion 110 and extends along the width direction (b) and between mask bodies 112. The cross-sectional view of the recessed portion 130 has the same structure as those shown in aforementioned drawings and is not elaborated herein. As to the ratio, the ratio of the total capacity of the recessed portion 130 in the mask portion 110 and the end portion 120 to the total volume of the mask portion 110 and the end portion 120 (after cut out) is preferably between 0.087 and 0.667.

Besides, the end recessed portion 134 and the mask recessed portion 132 preferably adopts the structure shown in FIG. 2B, formed on the rear surface 102 and the vapor deposition surface 104. Besides, a combination of the mask recessed portion 132 and the end recessed portion 134 can be selected for providing different thickness. For example, combination (1) includes selecting the structure shown in FIG. 4A as the end recessed portion 134 which is formed on the vapor deposition surface 104 of the metal mask 100 and selecting the structure shown in FIG. 4C as the mask recessed portion 132 which penetrates the vapor deposition surface 104 and the rear surface 102 by through holes 136. Combination (2) includes selecting the structure shown in FIG. 4B as the end recessed portion 134 which is formed on the rear surface 102 of the metal mask 100 and selecting the structure shown in FIG. 4C as the mask recessed portion 132 which penetrates the vapor deposition surface 104 and the rear surface 102 by through holes 136. By this design, while the metal mask 100 is used in the vapor deposition process, the smoothness of the metal mask 100 can be improved, and the wrinkle effect can be decreased to increase the yield rate; besides, the lifetime of the metal mask 100 can be extended to lower the processing cost.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A metal mask for vapor deposition process, comprising:
    a mask portion having a mask body and an outer frame surrounding and being connected to the mask body; and
    at least one end portion connected to an end of the outer frame of the mask portion;
    wherein at least one of the mask portion and the end portion has at least one recessed portion located outside the mask body, a ratio of a total capacity of the at least one recessed portion to a total volume of the mask portion and the end portions is between 0.087 and 0.667, and
    wherein the mask portion and the end portion together have a vapor deposition surface and a rear surface opposite to the vapor deposition surface;
    wherein the at least one recessed portion includes a first recessed portion formed on the vapor deposition surface, and a second recessed portion formed on the rear surface and corresponding one by one to the first recessed portion;
    wherein the first recessed portion includes a complete bottom surface and the second recessed portion includes a complete bottom surface; the complete bottom surfaces of the first and second recessed portions are configured without having a through hole therebetween.

2. The metal mask of claim 1, wherein the at least one recessed portion comprises at least one mask recessed portion formed on a surface of the outer frame, the ratio of a total capacity of the at least one mask recessed portion to a total volume of the mask portion is between 0.087 and 0.667.

3. The metal mask of claim 2, wherein the mask portion has an elongated rod shape, a part of the at least one mask recessed portion is located at two sides of the mask body and extends along an extending direction of the mask portion.

4. The metal mask of claim 2, wherein the mask portion has an elongated rod shape, a part of the at least one mask recessed portion located between two adjacent mask bodies extends across an extending direction of the mask portion.

5. The metal mask of claim 1, wherein the at least one recessed portion comprises at least one end recessed portion formed on a surface of the end portion, the ratio of a total capacity of the at least one end recessed portion to a total volume of the end portion is between 0.087 and 0.667.

6. The metal mask of claim 1, wherein the mask portion and the end portion together have a vapor deposition surface and a rear surface opposite to the vapor deposition surface, and at least a part of the recessed portion is formed on the vapor deposition surface.

7. The metal mask of claim 1, wherein the mask portion and the end portion together have a vapor deposition surface and a rear surface opposite to the vapor deposition surface, and at least a part of the recessed portion is formed on the rear surface.

8. The metal mask of claim 1, wherein the recessed portion formed on the vapor deposition surface has a depth different from the recessed portion formed on the rear surface.

9. The metal mask of claim 1, wherein the mask portion and the end portion together have a vapor deposition surface and a rear surface opposite to the vapor deposition surface, the recessed portions adjacent to each other are formed on the vapor deposition surface and the rear surface respectively.

* * * * *